(12) United States Patent
Yoshida et al.

(10) Patent No.: US 8,947,591 B2
(45) Date of Patent: Feb. 3, 2015

(54) SOLID-STATE IMAGING UNIT, METHOD OF MANUFACTURING SOLID-STATE IMAGING UNIT, AND ELECTRONIC APPARATUS

(75) Inventors: Atsushi Yoshida, Kumamoto (JP); Yuuji Kishigami, Kumamoto (JP)

(73) Assignee: Sony Corporation, Tokyo (JP)

( * ) Notice: Subject to any disclaimer, the term of this patent is extended or adjusted under 35 U.S.C. 154(b) by 400 days.

(21) Appl. No.: 13/412,898

(22) Filed: Mar. 6, 2012

(65) Prior Publication Data

US 2012/0249822 A1    Oct. 4, 2012

(30) Foreign Application Priority Data

Mar. 31, 2011  (JP) .................................. 2011-080995

(51) Int. Cl.
*H04N 5/225*  (2006.01)
*H01L 27/146*  (2006.01)

(52) U.S. Cl.
CPC .... *H01L 27/14618* (2013.01); *H01L 27/14683* (2013.01)
USPC ........................................................ 348/374

(58) Field of Classification Search
USPC ........................................................ 348/374
See application file for complete search history.

(56) References Cited

U.S. PATENT DOCUMENTS

| 7,880,796 | B2* | 2/2011 | Yamaguchi et al. | 348/335 |
| 8,159,604 | B2* | 4/2012 | Busse | 348/374 |
| 2001/0050717 | A1* | 12/2001 | Yamada et al. | 348/340 |
| 2008/0067334 | A1* | 3/2008 | Chuang et al. | 250/239 |
| 2008/0303939 | A1* | 12/2008 | Hsu et al. | 348/374 |

FOREIGN PATENT DOCUMENTS

| JP | 2002-57311 | 2/2002 |
| JP | 2006-313868 | 11/2006 |

* cited by examiner

*Primary Examiner* — Anthony J Daniels
(74) *Attorney, Agent, or Firm* — Oblon, Spivak, McClelland, Maier & Neustadt, L.L.P.

(57) ABSTRACT

A solid-state imaging unit includes: a solid-state imaging device mounted on a substrate; a bonding wire which electrically connects a pad formed on the solid-state imaging device and a lead formed on the substrate; a frame member having a frame shape which surrounds side portions of the solid-state imaging device; and an optical member having optical transparency and mounted on the frame member so as to face an imaging surface of the solid-state imaging device, wherein the frame member has a leg portion which protrudes from an optical member side toward the imaging surface of the solid-state imaging device, and the frame member and the solid-state imaging device are integrally fixed to each other in a state where the leg portion comes into contact with an intermediate area which is located between an imaging area and a pad forming area on the imaging surface.

9 Claims, 9 Drawing Sheets

SOLID-STATE IMAGING UNIT, METHOD OF MANUFACTURING SOLID-STATE IMAGING UNIT, AND ELECTRONIC APPARATUS

FIELD

The present disclosure relates to a solid-state imaging unit, a method of manufacturing the solid-state imaging unit, and an electronic apparatus using the solid-state imaging unit. Specifically, the present disclosure relates to the structure of a solid-state imaging unit.

BACKGROUND

As a solid-state imaging unit, a line sensor or an image sensor using a solid-state imaging device such as a CCD (Charge Coupled Device) or a CMOS (Complementary Metal Oxide Semiconductor) is typically used. The solid-state imaging unit has been widely used as an imaging unit of an electronic apparatus such as a digital video camera, a digital still camera, a digital camera having both video and still camera functions, or a mobile phone. In this specification, the digital video camera, the digital still camera, and the camera having both video and still camera functions are collectively referred to as a digital camera.

The solid-state imaging unit as described above includes a sensor unit in which a solid-state imaging device is mounted on a substrate and a lead on the substrate side and a pad on the solid-state imaging device side are electrically connected to each other by a bonding wire. In the sensor unit, a frame member of a frame shape or a bottomed box shape, which surrounds side portions of the solid-state imaging device, is mounted and an optical member which leads incident light to an imaging surface of the solid-state imaging device is mounted on the upper surface side of the frame member, whereby a solid-state imaging unit is configured (refer to JP-A-2002-57311 and JP-A-2006-313868, for example). As the optical member, for example, in a case where the solid-state imaging unit is a sensor package, a cover glass can be given, and in a case where the solid-state imaging unit is a camera module, a single or a plurality of lenses, an IR cut filter, or the like can be given.

Figure 11:
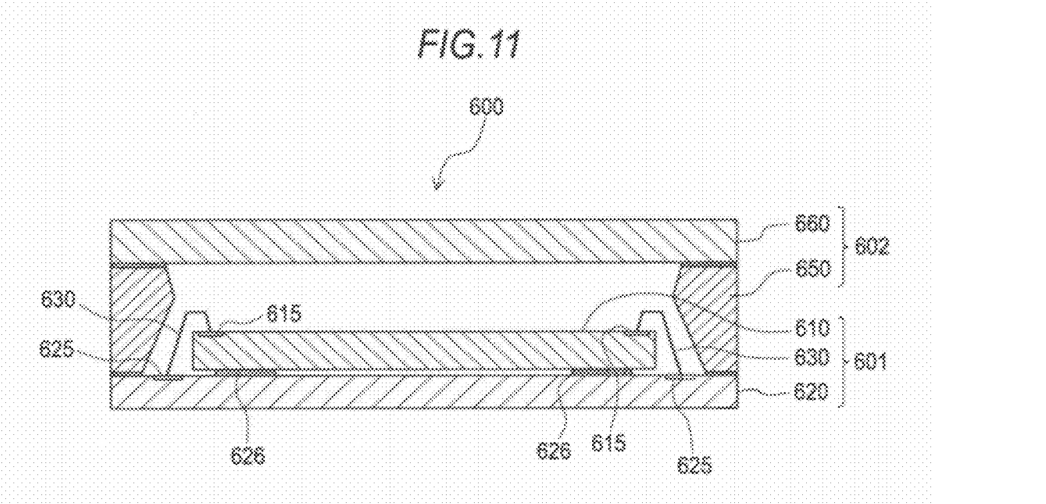
FIG. 11 is a schematic cross-sectional view of a general solid-state imaging unit in the related art.

A schematic cross-sectional view of a general solid-state imaging unit in the related art, which is used in a digital camera, is shown in FIG. 11. As shown in FIG. 11, a solid-state imaging unit 600 is a sensor package and is configured to broadly include a sensor unit 601 and a package 602.

The sensor unit 601 is configured to mainly include a solid-state imaging device 610 made of a sensor chip such as the above-described CCD or CMOS, a substrate 620 such as an interposer, a bonding wire 630, and the like. The solid-state imaging device 610 is mounted on the substrate 620 and fixed to the substrate 620 through a die bond 626. A pad 615 on the solid-state imaging device 610 side and a lead 625 on the substrate 620 side are electrically connected to each other by the bonding wire 630, so that the sensor unit 601 is configured.

The package 602 is configured to mainly include a frame member 650 and an optical member 660. The frame member 650 is formed into the form of a frame opened up and down and surrounding the outside of the bonding wire 630, and the lower surface of a leg portion extending downward is adhered and fixed to the upper surface of the substrate further on the outside than a connection portion of the bonding wire 630. The optical member 660 is adhered and fixed to the upper surface side of the frame member 650 so as to face an imaging surface of the solid-state imaging device 610. Then, light (a subject image) being incident through a camera lens (not shown) penetrates the optical member 660 and is then led to the solid-state imaging device. This configuration example is a configuration in which as the optical member 660, a cover glass (also referred to as a seal glass) is provided.

According to such a configuration, the solid-state imaging unit 600 is configured in which a subject image that penetrates the optical member 660 and is then imaged on the imaging surface is subjected to photoelectric conversion and read by the solid-state imaging device 610 and an image signal is output through the substrate 620. In an assembly process of the solid-state imaging unit 600, the frame member 650 is assembled to the sensor unit 601 and the optical member 660 is then assembled so as to cover an opening portion of the frame member 650 from above the frame member 650.

SUMMARY

In recent years, a reduction in size, higher quality (an increase in the number of pixels), and higher functionality of digital cameras has progressed, and there has also been strong demand for a reduction in size, higher quality (an increase in the number of pixels), and higher precision with respect to solid-state imaging units which are mounted on such electronic apparatuses. However, in a configuration with which a solid-state imaging unit such as a sensor package or a camera module has been provided in the past, the frame member 650 is disposed on the solid-state imaging device 610 which is mounted on the substrate 620, and on the outer periphery side of the bonding wire 630 which is disposed between the substrate 620 and the solid-state imaging device 610, so that it is in a situation where a further reduction in size is difficult.

Further, if a reduction in the size of the solid-state imaging unit is advanced, flare easily occurs in an output image. Specifically, light incident through the optical member 660 is reflected by a connection end portion of the bonding wire 630 and is incident on an imaging area (an effective pixel area) of the solid-state imaging device 610, whereby flare occurs. If the size of the solid-state imaging device 610 is reduced for a reduction in the size of the solid-state imaging unit, as described above, incident light from the optical member 660 is reflected by the bonding wire 630 and is easily incident on the imaging area of the solid-state imaging device 610, so that flare easily occurs.

It is therefore desirable to provide a solid-state imaging unit in which occurrence of flare is suppressed and a further reduction in size is possible, and a method of manufacturing the solid-state imaging unit. Further, it is desirable to provide a small and high-quality electronic apparatus.

An embodiment of the present disclosure is directed to a solid-state imaging unit including: a solid-state imaging device mounted on a substrate; a bonding wire which electrically connects a pad formed on the solid-state imaging device and a lead formed on the substrate; a frame member having a frame shape which surrounds side portions of the solid-state imaging device; and an optical member having optical transparency and mounted on the frame member so as to face an imaging surface of the solid-state imaging device, wherein the frame member has a leg portion (for example, a first leg portion 51 in an embodiment) which protrudes from an optical member side toward the imaging surface of the solid-state imaging device, and the frame member and the solid-state imaging device are integrally fixed to each other in a state where the leg portion comes into contact with an intermediate area which is located between an imaging area and a pad forming area on the imaging surface.

The solid-state imaging unit according to the embodiment of the present disclosure may be configured such that the leg portion is adhered to the intermediate area on the imaging surface, so that the frame member is fixed to the solid-state imaging device.

The solid-state imaging unit according to the embodiment of the present disclosure may be configured such that the frame member has a second leg portion which is connected to the leg portion and passes a side of the solid-state imaging device to extend toward the substrate and a wire accommodating portion in which the bonding wire connecting the pad and the lead is accommodated is formed between the leg portion and the second leg portion. At this time, the wire accommodating portion may be filled with resin having electrical insulating properties.

Another embodiment of the present disclosure is directed to a method of manufacturing a solid-state imaging unit. The method of manufacturing a solid-state imaging unit is configured to include: covering a sensor unit in which a solid-state imaging device is mounted on a substrate and a lead formed on the substrate and a pad formed on the solid-state imaging device are electrically connected to each other by a bonding wire, with a frame member which is formed into the form of a frame surrounding side portions of the solid-state imaging device and has a leg portion (for example, a first leg portion 51 in an embodiment) formed on the lower surface side so as to protrude toward an imaging surface of the solid-state imaging device, from above the sensor unit; integrally fixing the frame member and the solid-state imaging device to each other in a state where the leg portion comes into contact with an intermediate area which is located between an imaging area and a pad forming area on the imaging surface; and mounting an optical member having optical transparency on the upper surface side of the frame member so as to face the imaging surface of the solid-state imaging device.

Alternatively, the method of manufacturing a solid-state imaging unit is configured to include: covering a sensor unit in which a solid-state imaging device is mounted on a substrate and a lead formed on the substrate and a pad formed on the solid-state imaging device are electrically connected to each other by a bonding wire, with an optical unit (for example, a package 2 in an embodiment) which includes a frame member which is formed into the form of a frame surrounding side portions of the solid-state imaging device and has a leg portion (for example, a first leg portion 51 in an embodiment) formed on the lower surface side so as to protrude toward an imaging surface of the solid-state imaging device, and an optical member having optical transparency and mounted on the upper surface side of the frame member, from above the sensor unit; and integrally fixing the frame member and the solid-state imaging device to each other in a state where the optical member faces the imaging surface of the solid-state imaging device and the leg portion comes into contact with an intermediate area which is located between an imaging area and a pad forming area on the imaging surface.

Still another embodiment of the present disclosure is directed to an electronic apparatus including: a solid-state imaging unit; and a signal processing circuit which processes an output signal of the solid-state imaging unit, wherein the solid-state imaging unit includes a solid-state imaging device mounted on a substrate, a bonding wire which electrically connects a pad formed on the solid-state imaging device and a lead formed on the substrate, a frame member having a frame shape which surrounds side portions of the solid-state imaging device, and an optical member having optical transparency and mounted on the frame member so as to face the imaging surface of the solid-state imaging device, the frame member has a leg portion (for example, a first leg portion 51 in an embodiment) which protrudes from an optical member side toward the imaging surface, and the frame member and the solid-state imaging device are integrally fixed to each other in a state where the leg portion comes into contact with an intermediate area which is located between an imaging area and a pad forming area on the imaging surface.

In the solid-state imaging unit according to the embodiment of the present disclosure, the frame member has a leg portion protruding from the optical member side toward the imaging surface and the frame member and the solid-state imaging device are integrally fixed to each other in a state where the leg portion comes into contact with the intermediate area on the imaging surface. According to such a configuration, since light which penetrates the optical member and is then directed to the vicinity of the pad is blocked by the leg portion which is located between the imaging area and the pad forming area, the light is not irradiated to the bonding wire, so that occurrence of flare based on reflection from the bonding wire is suppressed. Therefore, it is possible to provide a solid-state imaging unit in which occurrence of flare is suppressed and a further reduction in size can be promoted.

In the method of manufacturing the solid-state imaging unit according to the embodiment of the present disclosure, the frame member and the solid-state imaging device are integrally fixed to each other in a state where the sensor unit is covered with the frame member from above and the leg portion of the frame member comes into contact with the intermediate area on the imaging surface. According to such a configuration, since light which penetrates the optical member and is then directed to the vicinity of the pad is blocked by the leg portion which is located between the imaging area and the pad forming area, the light is not irradiated to the bonding wire, so that occurrence of flare based on reflection from the bonding wire is suppressed. Therefore, it is possible to provide a manufacturing method in which occurrence of flare is suppressed and a further reduction in the size of the solid-state imaging unit can be promoted.

Alternatively, the frame member and the solid-state imaging device are integrally fixed to each other in a state where the sensor unit is covered with the optical unit (for example, a package 2 in an embodiment) from above and the leg portion of the frame member of the optical unit comes into contact with the intermediate area on the imaging surface. According to such a configuration, since light which penetrates the optical member and is then directed to the vicinity of the pad is blocked by the leg portion which is located between the imaging area and the pad forming area, the light is not irradiated to the bonding wire, so that occurrence of flare based on reflection from the bonding wire is suppressed. Therefore, it is possible to provide a manufacturing method in which occurrence of flare is suppressed and a further reduction in the size of the solid-state imaging unit can be promoted.

In the electronic apparatus according to the above embodiment of the present disclosure, a configuration is made in which the frame member of the solid-state imaging unit has a leg portion protruding from the optical member side toward the imaging surface and the frame member and the solid-state imaging device are integrally fixed to each other in a state where the leg portion comes into contact with the intermediate area on the imaging surface. According to such a configuration, since light which penetrates the optical member and is then directed to the vicinity of the pad is blocked by the leg portion which is located between the imaging area and the pad forming area, the light is not irradiated to the bonding wire, so that occurrence of flare based on reflection from the bonding wire is suppressed. Therefore, it is possible to provide a small and high-quality electronic apparatus using a downsized solid-state imaging unit in which occurrence of flare is suppressed.

BRIEF DESCRIPTION OF THE DRAWINGS

FIGS. 5A and 5B are explanatory diagrams contrasting the structure of a solid-state imaging unit in the related art with the structure of the solid-state imaging unit to which the present disclosure is applied, wherein

FIGS. 6A and 6B are explanatory diagrams contrasting the positioning situation of a frame member of the solid-state imaging unit in the related art with the positioning situation of a frame member of the solid-state imaging unit to which the present disclosure is applied, wherein

DETAILED DESCRIPTION

Figure 1:
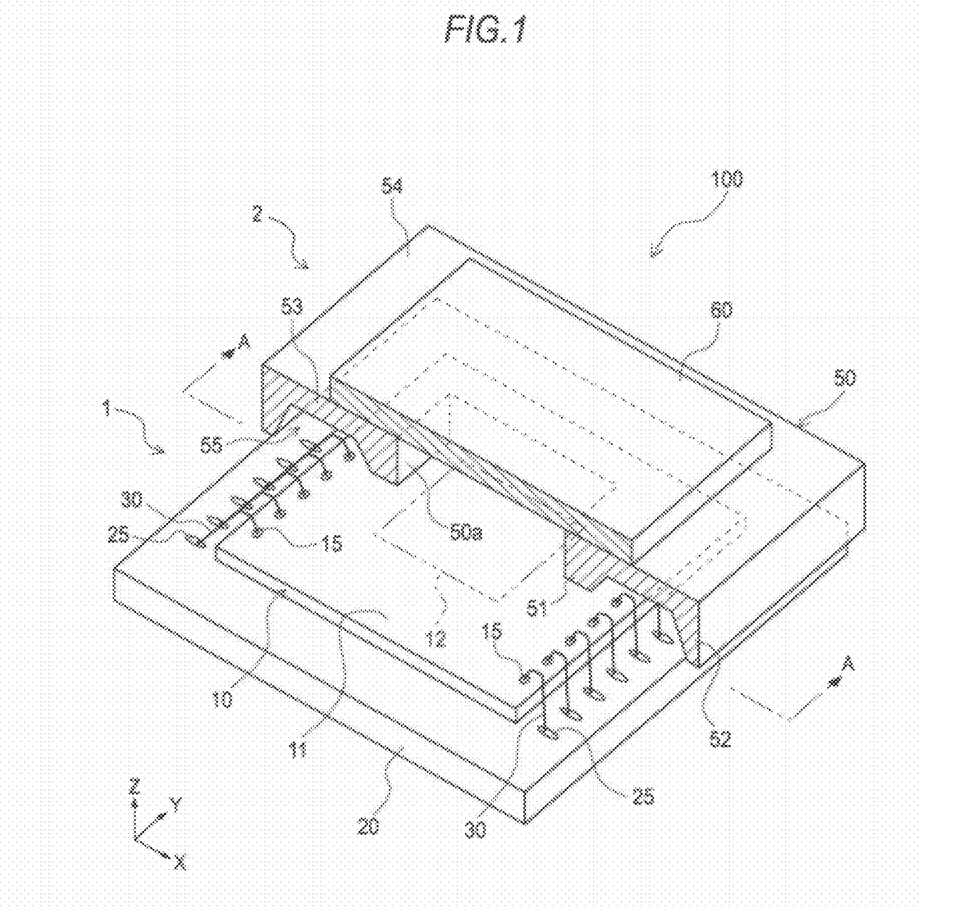
FIG. 1 is a schematic perspective view, partly cross-sectional, of a solid-state imaging unit to which the present disclosure is applied.
Figure 2:
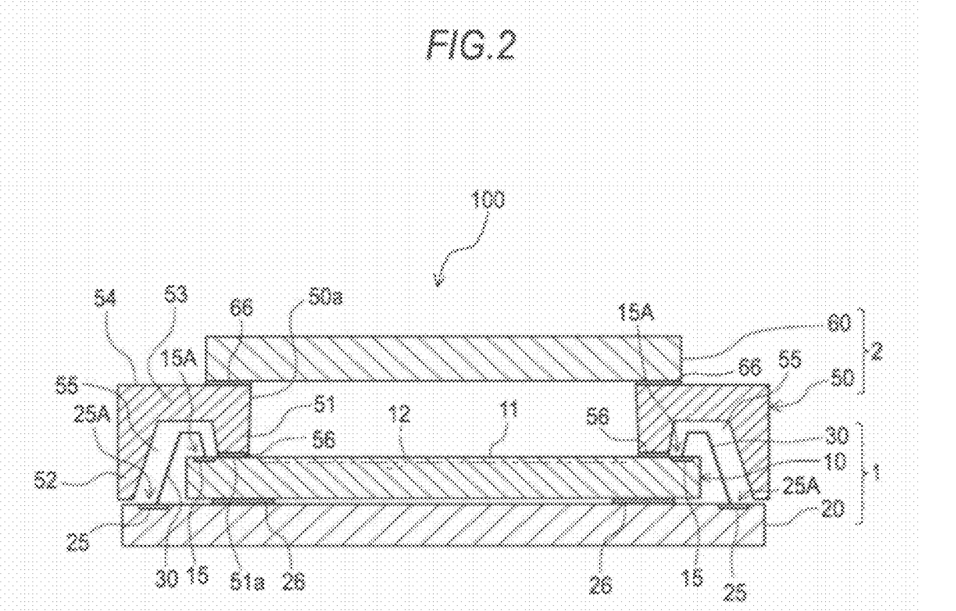
FIG. 2 is a cross-sectional view as viewed in the direction of arrow A-A in FIG. 1.
Figure 3:
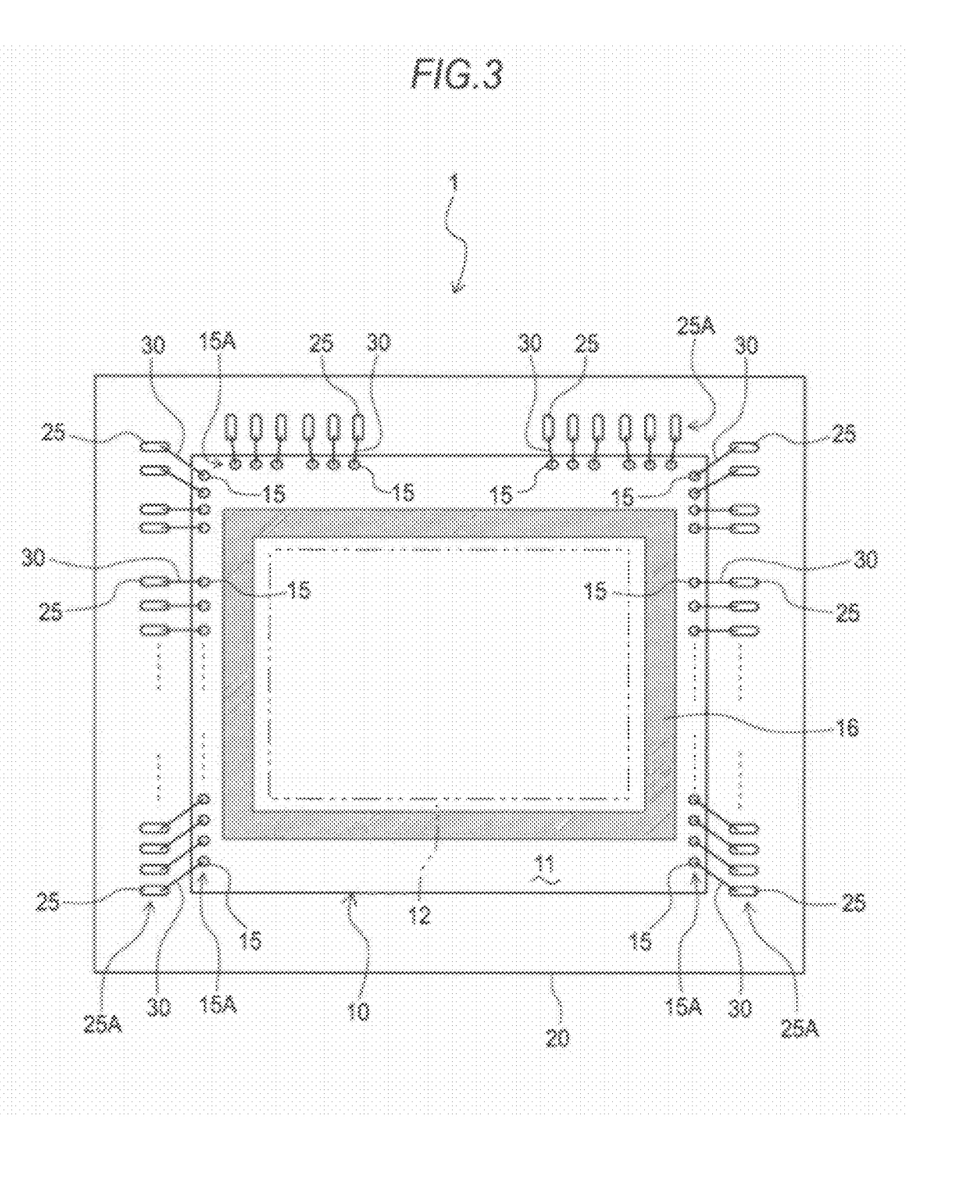
FIG. 3 is a schematic plan view of a sensor unit in the solid-state imaging unit to which the present disclosure is applied.

Hereinafter, embodiments of the present disclosure will be described with reference to the case where the present disclosure is applied to a package type solid-state imaging unit (a sensor package) as a representative example. A schematic perspective cross-sectional view of a solid-state imaging unit 100 to which the present disclosure is applied is shown in FIG. 1, and a cross-sectional view as viewed in the direction of arrow A-A in FIG. 1 is shown in FIG. 2. A schematic plan view of a sensor unit 1 is shown in FIG. 3. First, the overall configuration of the solid-state imaging unit 100 will be described referring to these drawings. In addition, for convenience of description, coordinate axes of X, Y, and Z are additionally stated in FIG. 1 and a description will be performed with a direction that is indicated by an arrow of an X axis referred to as the right side, the opposite direction thereto referred to as the left side, a direction that is indicated by an arrow of a Y axis referred to as the rear, the opposite direction thereto referred to as the front, and a direction that is indicated by an arrow of a Z axis referred to as the upside, and the opposite direction thereto referred to as the downside.

[Configuration of Solid-State Imaging Unit]

The solid-state imaging unit 100 is configured to broadly include the sensor unit 1 and a package 2.

The sensor unit 1 has a solid-state imaging device 10, a substrate 20 which retains the solid-state imaging device 10, and a bonding wire 30. The bonding wire 30 electrically connects a pad 15 formed on the solid-state imaging device 10 and a lead 25 formed on the substrate 20.

The solid-state imaging device 10 is a sensor chip such as a CCD or a CMOS. In this embodiment, as the solid-state imaging device 10, a rectangular thin plate-like image sensor is exemplified in which a large number of pixels are formed in a matrix in an X-Y plane and a two-dimensional image is produced from a pixel signal detected by each pixel. The solid-state imaging device 10 is mounted on the substrate 20. An imaging area 12 which is formed by effective pixels is provided at a central portion of an imaging surface 11 that is the upper surface of the solid-state imaging device 10. A large number of pads 15, each of which is an input-output terminal of an electric power supply, a control signal, an image signal, or the like, are formed side by side at marginal portions of the imaging surface 11 of the solid-state imaging device 10.

As shown in FIG. 3, in this embodiment, at the marginal portions of three sides (a left side, a right side and a rear side) among four sides surrounding the imaging area 12 and facing each other, a large number of pads 15, 15, 15, . . . are formed side by side along each side. In addition, the number or disposition of pads 15, sides (one side to four sides or more) in which the pads 15 are formed, or the like varies depending on the type of a sensor (a line sensor, an image sensor, a CCD, a CMOS, or the like), the number of effective pixels, chip size, or the like. However, the present disclosure is also applicable to any aspect. In this specification, an area 15A of the marginal portion of each side in which the pads 15, 15, 15, . . . are formed side by side is referred to as a "pad forming area".

The substrate 20 is a circuit substrate which transmits an input-output signal to the solid-state imaging device 10. In this embodiment, as the substrate 20, an interposer is exemplified. At marginal portions of the upper surface of the substrate 20, which surround the solid-state imaging device 10, a large number of leads 25, 25, 25, . . . are formed side by side to correspond to the pads 15, 15, 15, . . . formed on the solid-state imaging device 10. In this specification, an area 25A of the marginal portion of each side in which the leads 25, 25, 25, . . . are formed side by side is referred to as a "lead forming area".

The solid-state imaging device 10 is mounted on the upper surface of the substrate 20 and fixed to the substrate 20 through a die bond 26. The pad 15 on the solid-state imaging device 10 side and the lead 25 on the substrate 20 side are electrically connected to each other by the bonding wire 30, whereby the sensor unit 1 is configured. In addition, a configuration may also be made such that the substrate 20 is provided with an arithmetic processing circuit such as an image processing chip and an image signal output from the solid-state imaging device 10 is subjected to image processing and is then output.

The package 2 is configured to mainly include a frame member 50 and an optical member 60.

The frame member 50 is a frame-shaped member which has, at the center thereof, a rectangular opening 50a communicating up and down and has an outer square shape surrounding the side portions of the solid-state imaging device 10, as a whole. On the lower surface side of the frame member 50, a first leg portion 51 and a second leg portion 52, which will be described in detail later, are formed to protrude downward. Further, on the upper surface side of the frame member 50, a flat optical member mounting surface 54, on which the optical member 60 is mounted, is formed. The frame member 50 is fabricated by a common technique such as injection molding using, for example, a resin material in which a reflectance suppressing material such as carbon black is added to resin such as a liquid crystal polymer or PEEK (polyether ether ketone) and glass fibers or carbon fibers are added thereto as necessary.

The optical member 60 has optical transparency and is mounted on the frame member 50 so as to face the imaging surface 11 of the solid-state imaging device 10. The optical member 60 is a member which prevents attachment of foreign matter to the imaging surface 11 of the solid-state imaging device 10 and leads incident light to the solid-state imaging device 10. In this embodiment, as the optical member 60, a rectangular thin plate-like cover glass (seal glass) is exemplified. The optical member 60 is somewhat larger than the opening 50a of the frame member 50, thereby covering the opening 50a from above. The cover glass is made of, for example, an optical glass such as BK7 or quartz glass, or a transparent resin material such as polycarbonate or PMMA (polymethylmethacrylate resin).

The optical member 60 is adhered and fixed to the optical member mounting surface 54 of the frame member 50 by an adhesive 66 so as to face the imaging surface 11 of the solid-state imaging device 10. A lens unit as a camera lens (not shown) is provided above the optical member 60 and light which is incident through the lens unit penetrates the optical member 60 and is then led to the solid-state imaging device 10, thereby forming an image on the imaging area 12 formed in the imaging surface 11.

In the solid-state imaging unit 100 which is configured as described above, the first and second leg portions 51 and 52 each having a tongue shape in a cross-section view are formed on the lower surface side of the frame member 50 and a wire accommodating portion 55 that is an arch-like space is formed between the first leg portion 51 and the second leg portion 52. The first leg portion 51 and the second leg portion 52 form double rectangular frame shapes extending in a parallel fashion in a bottom view and are connected to each other on the upper surface side of the frame member 50 through an upper frame portion 53 which forms the wire accommodating portion 55 along with the first leg portion 51 and the second leg portion 52.

The first leg portion 51 is formed into the form of a rectangular frame in which the inner width dimensions between lower end portions of the sides facing each other, that is, the lengthwise and breadthwise opening dimensions of a lower end portion of the opening 50a are somewhat larger than the imaging area 12 of the solid-state imaging device 10. Further, the first leg portion 51 is formed such that the outer width dimension between the lower end portions of the sides facing each other is smaller than the inner width dimension between the pad forming areas 15A and 15A. A flat mounting surface 51a is formed at a lower end of the first leg portion 51. The frame member 50 is supported on the solid-state imaging device 10 in a state where the mounting surface 51a of the first leg portion 51 comes into contact with an area between the imaging area 12 and the pad forming area 15A.

Figure 4:
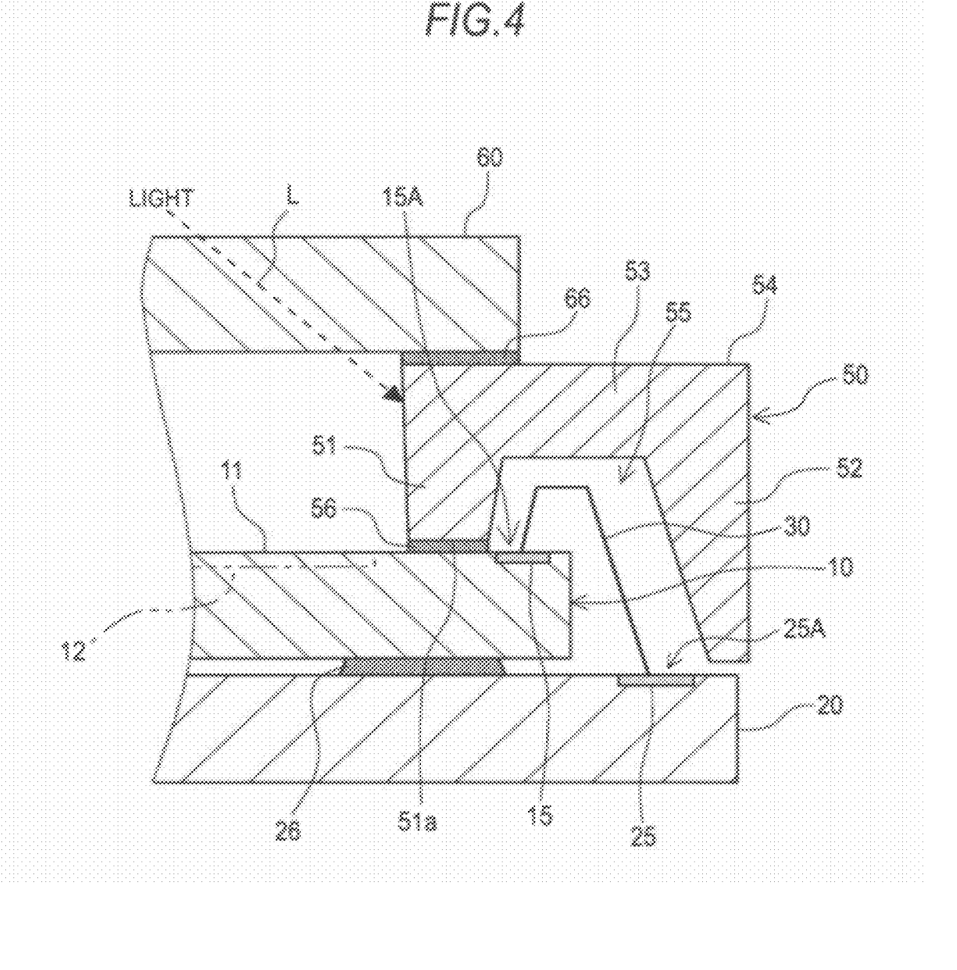
FIG. 4 is a partly enlarged view of a right side portion of the sensor unit in the solid-state imaging unit to which the present disclosure is applied.

In this specification, an area 16 having a given width, which is located further outside than the imaging area 12 on the imaging surface 11 and further inside than the pad forming area 15A, is referred to as an "intermediate area" (refer to FIG. 3). In FIG. 3, a site of the intermediate area 16 is shown by a hatched area. Further, a partly enlarged view of a right side portion in FIG. 2 is shown in FIG. 4. The first leg portion 51 is supported in a state where the mounting surface 51a comes into contact with the intermediate area 16 on the solid-state imaging device 10, and fixed to the solid-state imaging device 10 by an adhesive 56. As the adhesive 56, an ultraviolet cure type adhesive, heating cure type adhesive, or the like is suitably used. In addition, in this embodiment, a configuration is exemplified in which the first leg portion 51 is also formed at the frame member of the side (the front side) where the pad 15 is not formed, symmetrically to the side (the rear side) where the pads 15 are formed. In addition, in FIGS. 2 and 4, the adhesives 56 and 66 are represented in an exaggerated manner.

The second leg portion 52 is a portion which is connected to the first leg portion 51 and passes a side of the solid-state imaging device 10 to extend toward the substrate 20. The second leg portion 52 is formed into the form of a rectangular frame in which the outer width dimension between lower end portions of the sides facing each other, that is, the outside dimension of a lower end portion of the frame member 50 is somewhat larger than the outside dimension of the substrate 20. The second leg portion 52 has a height dimension (or, a clearance dimension between the second leg portion 52 and the substrate 20) set such that when the mounting surface 51a of the first leg portion is supported in contact with the intermediate area 16 of the solid-state imaging device 10, the lower end of the second leg portion 52 and the substrate 20 do not come into direct contact with each other and a slight clearance is formed between the two. In other words, the frame member 50 is directly mounted and supported on the imaging surface 11 of the solid-state imaging device 10 through the first leg portion 51, so that a height position in the up-and-down direction (the Z-axis direction) with respect to the solid-state imaging device 10 is defined.

The inner width dimension between the second leg portions 52 and 52 of the sides facing each other is formed larger than the outer width dimension between the corresponding lead forming areas 25A and 25A. In other words, the outer end of the lead forming area 25A is located further inside than the inner end of the second leg portion 52.

The wire accommodating portion 55 is an arch-like or downwardly opened concave space formed between the first leg portion 51 and the second leg portion 52. As described previously, the outer width dimension between the lower end portions of the first leg portions 51 and 51 facing each other is made to be smaller than the inner width dimension between the pad forming areas 15A and 15A and the inner width dimension between the lower end portions of the second leg portions 52 and 52 facing each other is made to be larger than the outer width dimension between the lead forming areas 25A and 25A. For this reason, the wire accommodating portion 55 forms a space which surrounds the solid-state imaging device 10 including the pad forming area 15A on the solid-state imaging device 10 side and the lead forming area 25A on the substrate 20 side, and accommodates the bonding wires 30, 30, . . . of each side.

The optical member mounting surface 54 is formed to have a given flatness at a given position in the Z direction with respect to the mounting surface 51a of the first leg portion formed in a rectangular frame shape. The optical member 60 is mounted on the optical member mounting surface 54 so as to cover the opening 50a from above the frame member 50 and adhered and fixed to the frame member 50 by the adhesive 66. As the adhesive 66, an ultraviolet cure type adhesive, heating cure type adhesive, or the like is suitably used.

In the solid-state imaging unit 100 which is configured as described above, the frame member 50 has the first leg portion 51 protruding from the optical member 60 side toward the imaging surface 11. Then, the frame member 50 and the solid-state imaging device 10 are integrally fixed to each other in a state where the first leg portion 51 comes into contact with the intermediate area 16 which is located between the imaging area 12 and the pad forming area 15A on the imaging surface 11. For this reason, light L which penetrates the optical member 60 and is then directed to the vicinity of the pad is blocked by the first leg portion 51, thereby not being irradiated to the bonding wire 30 (refer to FIG. 4). In this way, occurrence of flare due to reflection from the bonding wire 30 is suppressed.

Further, in the solid-state imaging unit 100, the first leg portion 51 is adhered to the intermediate area 16 on the imaging surface 11, whereby the frame member 50 is fixed to the solid-state imaging device 10. For this reason, an adhesion surface for securing adhesion strength between the frame member 50 and the sensor unit 1 may not be formed between the second leg portion 52 of the frame member 50 and an outer peripheral portion of the substrate 20. Further, it is possible to attain a reduction in the size of the opening 50a. In this way, it is possible to reduce the sizes of the substrate 20, the frame member 50, and the optical member 60, so that it is possible to reduce size and the weight of the solid-state imaging unit 100 as a whole.

Figure 5A:
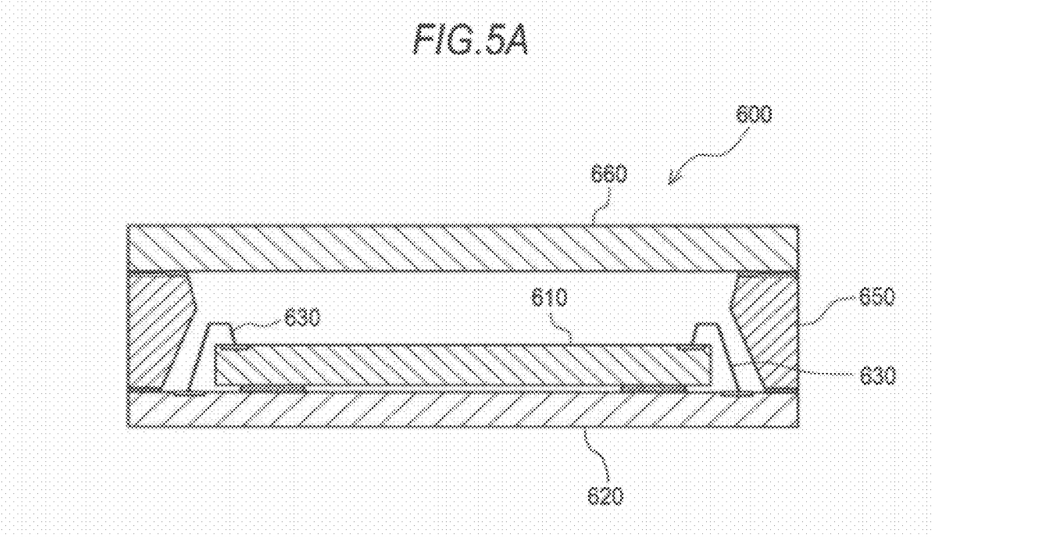
FIG. 5A is a schematic cross-sectional view for illustrating the structure of the solid-state imaging unit in the related art and FIG. 5B is a schematic cross-sectional view for illustrating the structure of the solid-state imaging unit to which the present disclosure is applied.
Figure 5B:
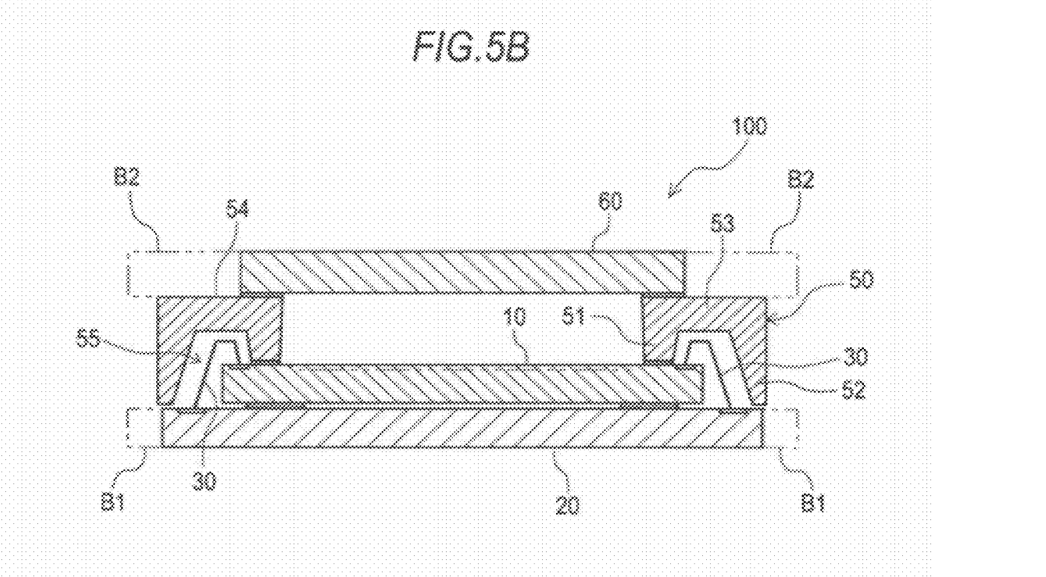

A state of contrasting structural differences between the solid-state imaging unit 600 in the related art described previously and the solid-state imaging unit 100 related to this embodiment is shown in FIGS. 5A and 5B. Of these, FIG. 5A is a schematic cross-sectional view for illustrating the structure of the solid-state imaging unit in the related art and FIG. 5B is a schematic cross-sectional view for illustrating the structure of the solid-state imaging unit to which the present disclosure is applied.

As can be appreciated from the contrast of both drawings of FIGS. 5A and 5B, according to the solid-state imaging unit 100 related to this embodiment, in comparison with the solid-state imaging unit 600 in the related art, it can be understood that it is possible to reduce the sizes of the substrate 20 and the optical member 60, so that it is possible to attain reductions in the size and the weight of the device as a whole. In comparison of the solid-state imaging unit 100 related to this embodiment with the solid-state imaging unit 600 in the related art, as shown by portions B1 and B2 shown by two-dot chain lines on both left and right sides in FIG. 5B, it is possible to reduce the sizes of the substrate 20 and the optical member 60.

Specifically, with respect to the substrate 20, because of a configuration in which the frame member 50 is adhered to the solid-state imaging device 10, an adhesion area (refer to symbol B1 in FIG. 5B) of the frame member 50 in the substrate 20 becomes unnecessary, so that it is possible to attain a reduction in size by a corresponding amount. Further, with respect to the optical member 60, similarly, because of a configuration in which the frame member 50 is adhered to the solid-state imaging device 10, the frame member 50 for supporting the optical member 60 is present at a position overlapping the solid-state imaging device 10 over a connection place by the bonding wire 30, so that it is possible to reduce the size of the optical member 60 by an amount allowing a fixing position of the optical member 60 to the frame member 50 be located above the solid-state imaging device 10 (refer to symbol B2 in FIG. 5B).

In this manner, according to the solid-state imaging unit 100 related to this embodiment, it becomes possible to omit the outer peripheral portion of the substrate 20 and the outer peripheral portion of the optical member 60 in comparison with the solid-state imaging unit 600 in the related art, so that it is possible to attain reductions in the size and the weight of each member. As a result, it is possible to reduce the size and the weight of the device as a whole.

Further, in the solid-state imaging unit 100 related to this embodiment, the first leg portion 51 is formed on the lower surface side of the frame member 50 so as to surround the imaging area 12, the lower end thereof is adhered and fixed to the intermediate area 16, and the optical member 60 is adhered and fixed to the upper surface side of the frame member 50 so as to face the imaging surface 11, so that the imaging area 12 is sealed. For this reason, out gas capable of being generated at a member further on the outer periphery side than the pad forming area 15A, moisture which is contained in the air, surrounding dust, or the like does not enter the imaging area 12, so that it is possible to improve long-term reliability.

Further, in the solid-state imaging unit 100, in a state where the first leg portion 51 comes into contact with the imaging surface 11, that is, a state where the frame member 50 is positioned in the Z-axis direction with the imaging surface 11 of the solid-state imaging device 10 as a standard, the frame member 50 is mounted on and fixed to the solid-state imaging device 10 by the adhesive 56. In this way, it is possible to make adjustment work at the time of assembly of the solid-state imaging unit 100 concise and easy.

Figure 6A:
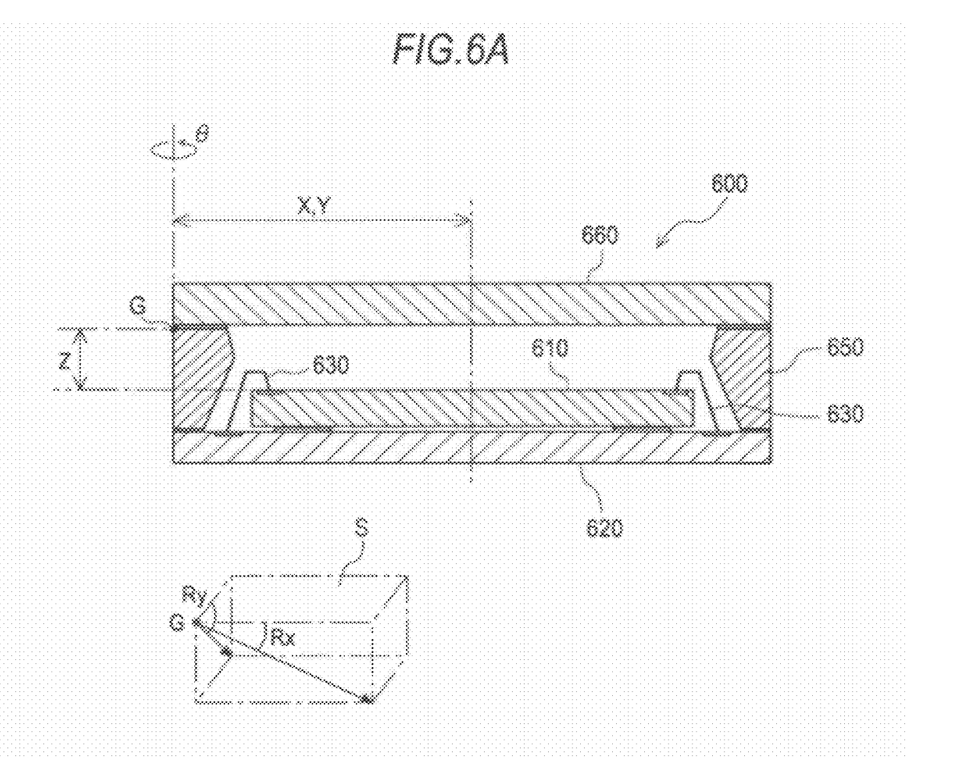
FIG. 6A is a schematic cross-sectional view for illustrating the positioning situation in the solid-state imaging unit in the related art and FIG. 6B is a schematic cross-sectional view for illustrating the positioning situation in the solid-state imaging unit to which the present disclosure is applied.
Figure 6B:
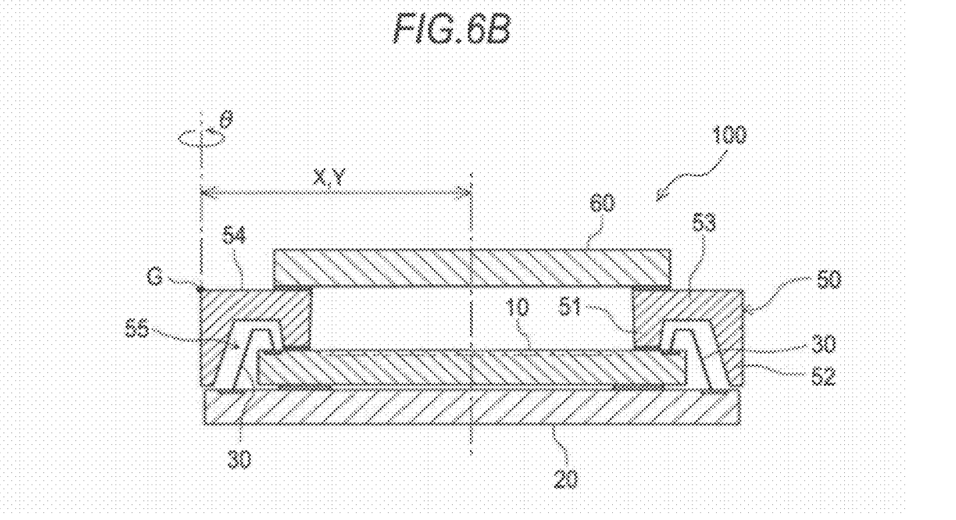

A state of contrasting the situations of positioning of the frame member to the solid-state imaging device in the solid-state imaging device in the solid-state imaging unit 600 in the related art and the solid-state imaging unit 100 related to this embodiment is shown in FIGS. 6A and 6B. Of these, FIG. 6A is a schematic cross-sectional view for illustrating the positioning situation in the solid-state imaging unit in the related art and FIG. 6B is a schematic cross-sectional view for illustrating the positioning situation in the solid-state imaging unit to which the present disclosure is applied.

As shown in FIG. 6A, in the solid-state imaging unit 600 in the related art, the frame member 650 is mounted on and fixed to the upper surface of the substrate 620. For this reason, when the upper surface of the frame member 650 is set to be a reference plane S and a given position (for example, a left front end portion) on the reference plane S is set to be an origin G of the frame member 650, it is necessary to perform positioning of the frame member 650 to the solid-state imaging device 610 by 6-axis adjustment.

Specifically, in the solid-state imaging unit 600 in the related art, it is necessary to perform positioning adjustment for a total of 6 axes; the positions in the X-axis, Y-axis, and Z-axis directions of the frame member 650 to the solid-state imaging device 610, a rotation angle θ around the Z axis, a tilt Rx around the X axis, and a tilt Ry around the Y axis. In a state where the position of the frame member 650 to the solid-state imaging device 610 has been adjusted by 6-axis adjustment in this manner, an adhesive for fixing the frame member 650 is cured. Such necessity of the 6-axis adjustment is due to the fact that even if the frame member 650 has sufficiently high degree of precision, inevitable variation occurs in a relative position of the solid-state imaging device 610 and the substrate 620 adhered to each other through die bond.

In contrast to this, in the solid-state imaging unit 100 related to this embodiment, the frame member 50 is directly mounted on and fixed to the imaging surface 11 of the solid-state imaging device 10. For this reason, when the upper surface (the optical member mounting surface 54) of the frame member 50 is set to be a reference plane and a given position (a left front end portion) on the plane is set to be an origin G of the frame member 50, it is possible to carry out the positioning of the frame member 50 to the solid-state imaging device 10 by 3-axis adjustment.

Specifically, in the solid-state imaging unit 100 related to this embodiment, it is acceptable if positioning adjustment is performed for a total of 3 axes; the positions in the X-axis and Y-axis directions of the frame member 50 to the solid-state imaging device 10, and a rotation angle θ around the Z axis. In a state where the position of the frame member 50 to the solid-state imaging device 10 has been adjusted by the 3-axis adjustment in this manner, an adhesive for fixing the frame member 50 is cured. The reason that the positioning of the frame member 50 can be performed by the 3-axis adjustment in this manner is because the position in the Z-axis direction and the tilts Rx and Ry of the optical member mounting surface 54 are defined by making the degree of precision of the frame member 50 be within a given range for a configuration in which the first leg portion 51 of the frame member 50 is directly supported on the imaging surface 11 of the solid-state imaging device 10.

That is, according to the solid-state imaging unit 100 related to this embodiment, in comparison with the solid-state imaging unit 600 in the related art, adjustment of 3 axes: the height direction (the Z direction) from the imaging surface of the solid-state imaging device 610 and the tilts (Rx and Ry) of the imaging surface, becomes unnecessary, and it is possible to cope with the positioning adjustment by using adjustment of 3 axes: the horizontal and vertical directions (X and Y) and rotation direction (θ) of the solid-state imaging device 10, whereas the related art requires the 6-axis adjustment. In this way, an assembly process of the solid-state imaging unit 100 can be reduced and a position adjustment process can be simplified. In this manner, according to the solid-state imaging unit 100 related to this embodiment, it is possible to make adjustment work at the time of assembly of the device concise and easy, and eventually, it is possible to attain a reduction in the cost of the device.

Further, according to the solid-state imaging unit 100 related to this embodiment, since the positioning of the optical member 60 to the solid-state imaging device 10 is performed by the frame member 50, when mounting the lens unit which is provided above the optical member 60, as described above, it becomes possible to perform position adjustment on the basis of the upper surface of the optical member 60. In this way, it is possible to attain a reduction in working hours and also high-precision mounting of the lens unit becomes possible.

Further, according to the solid-state imaging unit 100 related to this embodiment, because of a configuration in which the frame member 50 is directly fixed to the solid-state imaging device 10, it is possible to improve the conductivity of heat generated at the solid-state imaging device 10 and it is possible to improve the heat dissipation of the solid-state imaging device 10.

Figure 7:
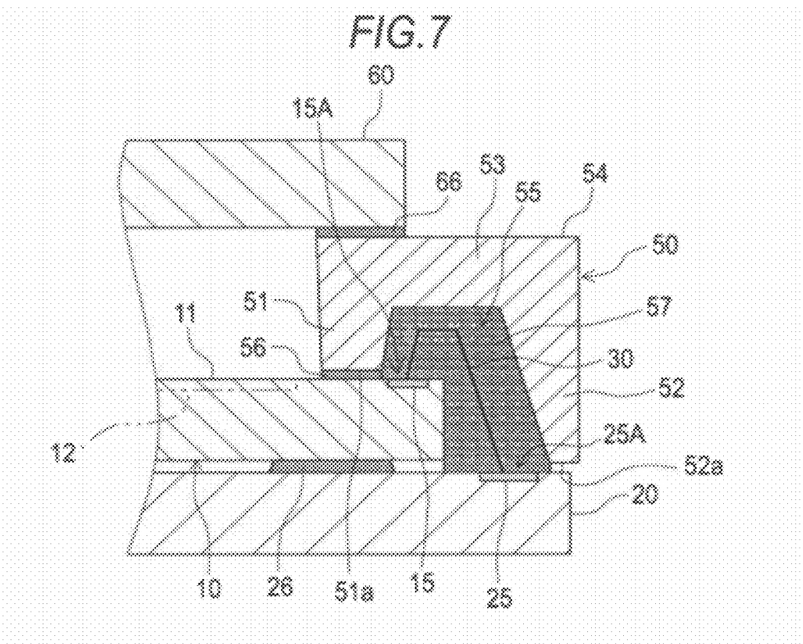
FIG. 7 is a schematic cross-sectional view illustrating a configuration in which a wire accommodating portion of the solid-state imaging unit to which the present disclosure is applied is filled with resin having electrical insulating properties.

A modified example of the solid-state imaging unit 100 related to this embodiment is shown in FIG. 7. As shown in FIG. 7, in the solid-state imaging unit 100, a configuration may also be made such that the wire accommodating portion 55 is filled with resin 57 having electrical insulating properties. The resin 57 is, for example, a silicone sealant or the like for potting or molding.

According to the configuration in which the wire accommodating portion 55 is filled with the resin 57 in this manner, it is possible to suppress corrosion of the bonding wire 30, the pad 15, the lead 25, or the like by moisture which is contained in the air, or out gas. In this way, it is possible to prevent a decrease in connection reliability due to corrosion of the pad 15 or the like. Further, the resin 57 is filled in the wire accommodating portion 55 in which a wire connection portion of the bonding wire 30 is present, whereby intrusion of foreign matter such as dust into the wire accommodating portion 55 is prevented. In this way, a short circuit in the wire connection portion of the bonding wire 30 by foreign matter is prevented.

Further, since adhesion action of the frame member 50 on the solid-state imaging device 10 and the substrate 20 can be obtained by the resin 57 which is filled in the wire accommodating portion 55, it is possible to improve the adhesion strength of the frame member 50. Further, according to the configuration in which the wire accommodating portion 55 is filled with the resin 57, it is possible to prevent a shake of the bonding wire 30 or mutual contact, breaking, or the like of the bonding wires 30 due to external vibration or the like.

In the configuration in which the resin 57 is filled in the wire accommodating portion 55, by forming a hole or a cutout making the wire accommodating portion 55 be opened to the outside in a side marginal portion of the substrate 20 or the second leg portion 52 of the frame member 50, it is possible to easily perform filling of the resin 57. Further, from the viewpoint of suppressing outflow of the resin 57 from the wire accommodating portion 55 through a clearance between the upper surface of the substrate 20 and a lower end surface 52a of the second leg portion 52 at the time of filling of the resin 57 into the wire accommodating portion 55, it is preferable that the clearance between the upper surface of the substrate 20 and the lower end surface 52a of the second leg portion 52 be narrow.

Figure 8:
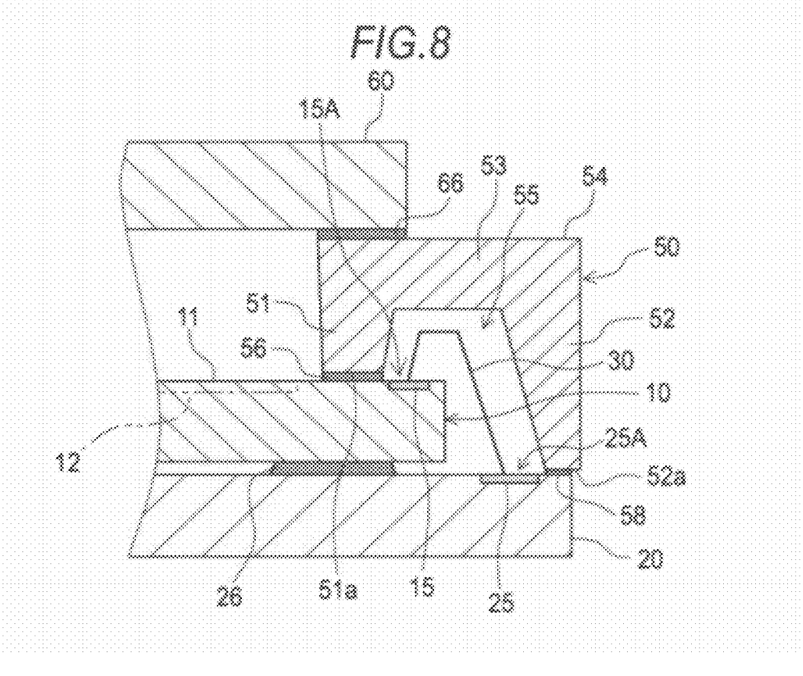
FIG. 8 is a schematic cross-sectional view illustrating a configuration in which a substrate and a frame member of the solid-state imaging unit to which the present disclosure is applied are adhered to each other.

Another modified example of the solid-state imaging unit 100 related to this embodiment is shown in FIG. 8. As shown in FIG. 8, in the solid-state imaging unit 100, the substrate 20 and the frame member 50 may also be adhered to each other by an adhesive 58. In this case, the adhesive 58 is applied to the lower end surface of the second leg portion 52 or the upper surface of the side marginal portion of the substrate 20. Further, in the configuration in which the second leg portion 52 and the substrate 20 are adhered to each other by the adhesive 58, from the viewpoint of securing an adhesion surface, it is preferable that the lower end surface 52a of the second leg portion 52 be wide to an extent not interfering in the lead forming area 25A.

According to the configuration in which the second leg portion 52 and the substrate 20 are adhered to each other by the adhesive 58 in this manner, it is possible to improve adhesion strength between the frame member 50 and the sensor unit 1.

Figure 9A:
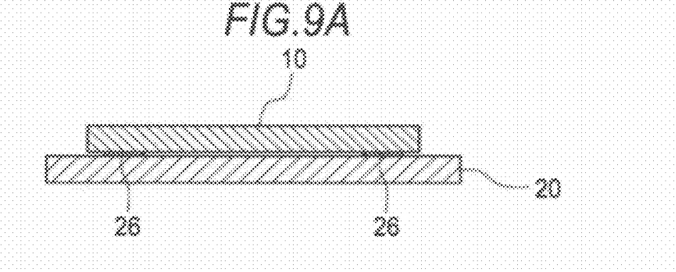
FIGS. 9A to 9D are explanatory diagrams for illustrating a method of manufacturing the solid-state imaging unit to which the present disclosure is applied.

Next, a method of manufacturing the solid-state imaging unit 100 related to this embodiment will be described with reference to FIGS. 9A to 9D. In the method of manufacturing the solid-state imaging unit 100 related to this embodiment, first, the solid-state imaging device 10 is mounted on the upper surface of the substrate 20. That is, as shown in FIG. 9A, the solid-state imaging device 10 is positioned and placed on the upper surface of the substrate 20 and the solid-state imaging device 10 is then fixed to the substrate 20 by the die bond 26.

Figure 9B:
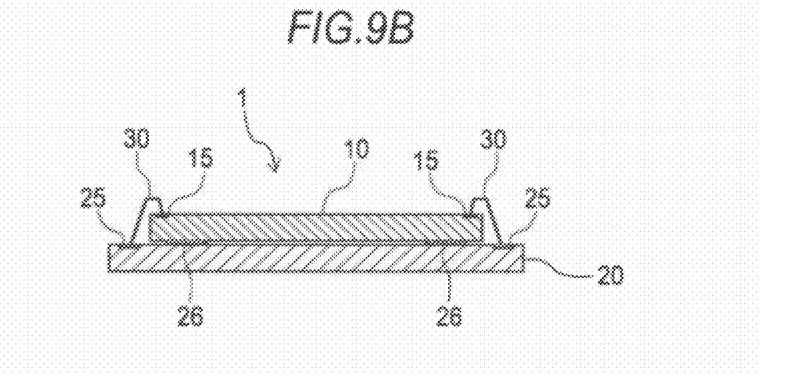

Next, as shown in FIG. 9B, the pads 15, 15, . . . formed on each side of the solid-state imaging device 10 and the leads 25, 25, . . . formed on each side of the substrate 20 and respectively corresponding to the pads 15, 15, . . . are electrically connected to each other by the bonding wires 30. In this way, the sensor unit 1 is configured.

Figure 9C:
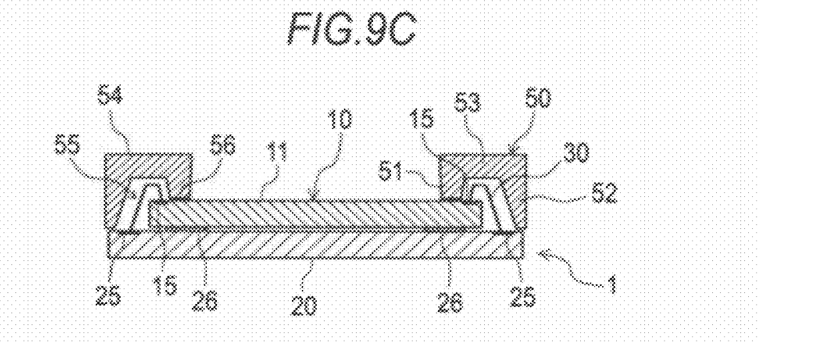

Subsequently, as shown in FIG. 9C, in a state where the frame member 50 is positioned to cover the sensor unit 1 from above and the first leg portion 51 comes into contact with the intermediate area 16 (refer to FIG. 3) on the imaging surface 11 of the solid-state imaging device 10, the frame member 50 and the solid-state imaging device 10 are integrally fixed to each other. At this time, an adhesion site where the frame member 50 and the solid-state imaging device 10 are integrally fixed to each other may also be a site other than the first leg portion 51. However, in this embodiment, the two are integrally fixed to each other by the adhesive 56 applied to the intermediate area 16 or the mounting surface 51a (refer to FIG. 4). In this process, the positioning of the frame member 50 to the solid-state imaging device 10 can be easily performed by the 3-axis adjustment, as described above.

The adhesive 56 which is used for the fixing of the frame member 50 to the solid-state imaging device 10 is an ultraviolet cure type adhesive, a heating cure type adhesive, or the like. In a state where the frame member 50 is positioned relative to the solid-state imaging device 10 in regard to each direction of the X-axis direction, the Y-axis direction, and the θ direction around the Z axis of the frame member 50 by the 3-axis adjustment, the adhesive 56 is solidified by ultraviolet irradiation to an adhesion site or heating.

Figure 9D:
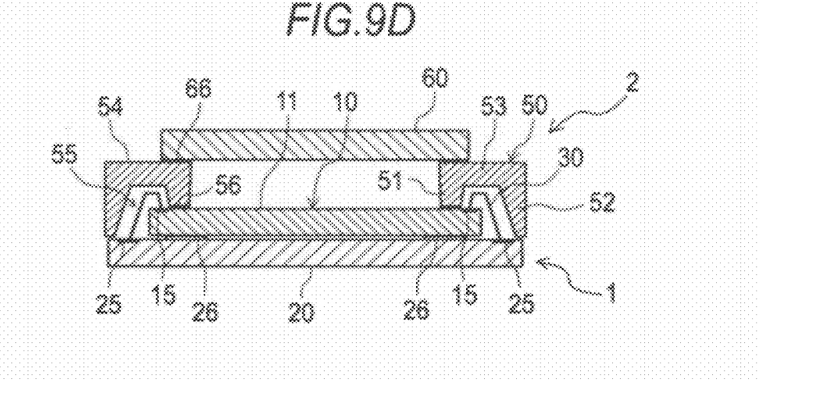

Then, as shown in FIG. 9D, the optical member 60 is positioned to cover the frame member 50 from above and the optical member 60 is fixed to the frame member 50 by the adhesive 66 applied to the optical member mounting surface 54. The adhesive 66 which is used for the fixing of the optical member 60 to the frame member 50 is, for example, an ultraviolet cure type adhesive, a heating cure type adhesive, or the like, similarly to the adhesive 56. In a state where, for example, similarly to the positioning of the frame member 50 to the solid-state imaging device 10, the optical member 60 is positioned relative to the frame member 50 in regard to each direction of the X-axis direction, the Y-axis direction, and the θ direction around the Z axis of the optical member 60 by the 3-axis adjustment, the adhesive 66 is solidified by ultraviolet irradiation to an adhesion site or heating.

In such a method of manufacturing the solid-state imaging unit 100, the frame member 50 has the first leg portion 51 protruding from the optical member 60 side toward the imaging surface 11. Then, in a state where the first leg portion 51 comes into contact with the intermediate area 16 which is located between the imaging area 12 and the pad forming area 15A on the imaging surface 11 (refer to FIG. 2), the frame member 50 and the solid-state imaging device 10 are integrally fixed to each other.

For this reason, the light L which penetrates the optical member 60 and is then directed to the vicinity of the pad is blocked by the first leg portion 51, thereby not being irradiated to the bonding wire 30 (refer to FIG. 4). In this way, it is possible to manufacture the solid-state imaging unit 100 in which occurrence of flare due to reflection from the bonding wire 30 is suppressed.

Further, since the first leg portion 51 is adhered to the intermediate area 16 on the imaging surface, whereby the frame member 50 is fixed to the solid-state imaging device 10, it is possible to manufacturing the smaller and lighter solid-state image device 100 in which the sizes of the substrate 20, the frame member 50, and the optical member 60 are reduced.

Further, since the first leg portion 51 is mounted on and fixed to the imaging surface 11 by the adhesive 56 in a state where the first leg portion 51 comes into contact with the imaging surface 11, it is possible to make adjustment work at the time of assembly of the solid-state imaging unit 100 concise and easy.

In addition, in this embodiment, a configuration is exemplified in which the frame member 50 is mounted on and fixed to the sensor unit 1 and the optical member 60 is then adhered and fixed to the fixed frame member 50. However, the mounting process of the optical member 60 can be appropriately changed depending on the configuration of the solid-state imaging unit 100. Specifically, a configuration may also be made such that the package 2 as an optical unit is formed by mounting the optical member 60 on the frame member 50 in advance and the package 2 is then fixedly mounted on the sensor unit 1.

In the embodiment described above, a configuration in which the optical member 60 is a cover glass is exemplified. However, it is acceptable if the optical member 60 is a member leading light to the solid-state imaging device 10, and the optical member 60 may also be a single or a plurality of lenses or the like. As a solid-state imaging unit provided with such a lens, a lens unit which is used in a mobile phone, an information terminal, or the like is exemplified.

[Configuration Example of Electronic Apparatus]

Figure 10:
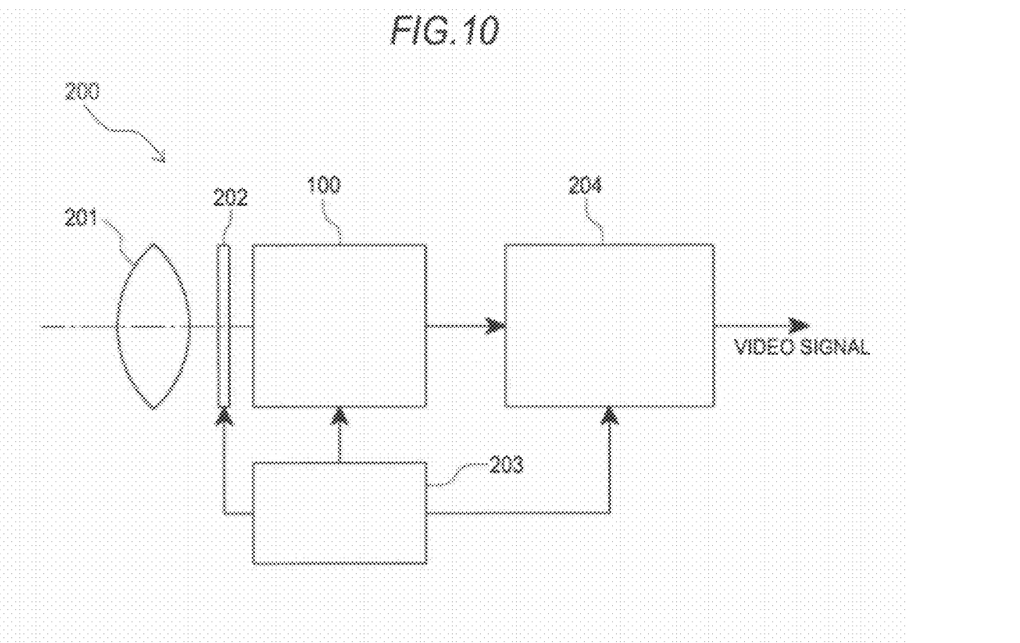
FIG. 10 is a block diagram illustrating a schematic configuration of an imaging section of an electronic apparatus to which the present disclosure is applied.

The solid-state imaging unit 100 related to the embodiment described above is applied to various electronic apparatuses such as a digital camera (a digital still camera or a digital video camera), a mobile phone having an imaging function, and other apparatuses, for example. Hereinafter, a video camera 200 that is one example of an electronic apparatus which is provided with the solid-state imaging unit related to the above-described embodiment will be described using FIG. 10. FIG. 10 is a block diagram illustrating the configuration of the video camera 200.

The video camera 200 is for performing photographing of a still image of a moving image. The video camera 200 includes the solid-state imaging unit 100 related to the above-described embodiment, an optical system 201, a shutter device 202, a system controller 203, and a signal processing section 204.

The optical system 201 is configured as an optical lens system having a single or a plurality of optical lenses, for example, and leads incident light to a light-receiving sensor section of the solid-state imaging unit 100. The optical system 201 makes image light (incident light) from a photographic subject be imaged on the imaging surface 11 of the solid-state imaging unit 100. In this way, signal charges are accumulated in the solid-state imaging unit 100 for a certain period of time. The solid-state imaging unit 100 outputs an image signal which is obtained by converting the image light imaged by the optical system 201 into an electric signal in pixel unit. The shutter device 202 has a configuration for controlling a light irradiation time to the solid-state imaging unit 100 and a light shielding time.

The system controller 203 outputs a control signal to the solid-state imaging unit 100 or the signal processing section 204 and controls an operation of the entirety of the video camera 200. The system controller 203 generates a driving signal (a timing signal) for driving the solid-state imaging unit 100 at a given timing and supplies it to the solid-state imaging unit 100. A transfer operation or the like of the signal charge of the solid-state imaging unit 100 is controlled by the driving signal which is supplied from the system controller 203 to the solid-state imaging unit 100. That is, the solid-state imaging unit 100 performs a transfer operation or the like of the signal charge by the driving signal which is supplied from the system controller 203.

The system controller 203 has a function to generate various pulse signals as the driving signals for driving the solid-state imaging unit 100 and a function as a driver which converts the generated pulse signal into a drive pulse for driving the solid-state imaging unit 100. The system controller 203 also performs generation and supply of a driving signal for controlling an operation of the shutter device 202.

The signal processing section 204 has a function to perform a variety of signal processing and processes an output signal of the solid-state imaging unit 100, thereby producing an image of a photographic subject. The signal processing section 204 processes an input signal, thereby outputting a video signal. The video signal output from the signal processing section 204 is stored in a storage medium such as a memory or output to a monitor. In addition, the video camera 200 has a power supply section such as a battery which supplies a power supply to the system controller 203 or the like, a storage section which stores a video signal or the like generated by imaging, a control section which controls the entirety of the apparatus, and the like.

In this manner, according to the video camera 200 which is provided with the solid-state imaging unit 100 related to this embodiment, occurrence of flare due to reflection from the bonding wire 30 in the solid-state imaging unit 100 is suppressed. Accordingly, it is possible to provide a small and high-quality electronic apparatus in which occurrence of flare is suppressed.

In addition, the present disclosure can be implemented as the following configurations.

(1) A solid-state imaging unit including:
a solid-state imaging device mounted on a substrate,
a bonding wire which electrically connects a pad formed on the solid-state imaging device and a lead formed on the substrate,
a frame member having a frame shape which surrounds side portions of the solid-state imaging device, and
an optical member having optical transparency and mounted on the frame member so as to face an imaging surface of the solid-state imaging device,
wherein the frame member has a leg portion which protrudes from an optical member side toward the imaging surface of the solid-state imaging device, and
the frame member and the solid-state imaging device are integrally fixed to each other in a state where the leg portion comes into contact with an intermediate area which is located between an imaging area and a pad forming area on the imaging surface.

(2) The solid-state imaging unit according to the above (1), wherein the leg portion is adhered to the intermediate area on the imaging surface, so that the frame member is fixed to the solid-state imaging device.

(3) The solid-state imaging unit according to the above (1) or (2), wherein the frame member has a second leg portion which is connected to the leg portion and passes a side of the solid-state imaging device to extend toward the substrate, and
a wire accommodating portion in which the bonding wire connecting the pad and the lead is accommodated is formed between the leg portion and the second leg portion.

(4) The solid-state imaging unit according to the above (3), wherein the wire accommodating portion is filled with resin having electrical insulating properties.

(5) A method of manufacturing a solid-state imaging unit, including:

covering a sensor unit in which a solid-state imaging device is mounted on a substrate and a lead formed on the substrate and a pad formed on the solid-state imaging device are electrically connected to each other by a bonding wire, with a frame member which is formed into the form of a frame surrounding side portions of the solid-state imaging device and has a leg portion formed on the lower surface side so as to protrude toward an imaging surface of the solid-state imaging device, from above the sensor unit;
integrally fixing the frame member and the solid-state imaging device to each other in a state where the leg portion comes into contact with an intermediate area which is located between an imaging area and a pad forming area on the imaging surface; and
mounting an optical member having optical transparency on the upper surface side of the frame member so as to face the imaging surface of the solid-state imaging device.

(6) The method of manufacturing a solid-state imaging unit according to the above (5), wherein the leg portion is adhered to the intermediate area on the imaging surface, so that the frame member is fixed to the solid-state imaging device.

(7) A method of manufacturing a solid-state imaging unit, including:
covering a sensor unit in which a solid-state imaging device is mounted on a substrate and a lead formed on the substrate and a pad formed on the solid-state imaging device are electrically connected to each other by a bonding wire, with an optical unit which includes a frame member which is formed into the form of a frame surrounding side portions of the solid-state imaging device and has a leg portion formed on the lower surface side so as to protrude toward an imaging surface of the solid-state imaging device, and an optical member having optical transparency and mounted on the upper surface side of the frame member, from above the sensor unit; and
integrally fixing the frame member and the solid-state imaging device to each other in a state where the optical member faces the imaging surface of the solid-state imaging device and the leg portion comes into contact with an intermediate area which is located between an imaging area and a pad forming area on the imaging surface.

(8) The method of manufacturing a solid-state imaging unit according to the above (7), wherein the leg portion is adhered to the intermediate area on the imaging surface, so that the frame member is fixed to the solid-state imaging device.

(9) An electronic apparatus including:
a solid-state imaging unit; and
a signal processing circuit which processes an output signal of the solid-state imaging unit,
wherein the solid-state imaging unit includes
a solid-state imaging device mounted on a substrate,
a bonding wire which electrically connects a pad formed on the solid-state imaging device and a lead formed on the substrate,
a frame member having a frame shape which surrounds side portions of the solid-state imaging device, and
an optical member having optical transparency and mounted on the frame member so as to face the imaging surface of the solid-state imaging device,
the frame member has a leg portion which protrudes from an optical member side toward the imaging surface of the solid-state imaging device, and
the frame member and the solid-state imaging device are integrally fixed to each other in a state where the leg portion comes into contact with an intermediate area which is located between an imaging area and a pad forming area on the imaging surface.

The present disclosure contains subject matter related to that disclosed in Japanese Priority Patent Application JP 2011-080995 filed in the Japan Patent Office on Mar. 31, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging unit comprising:
a solid-state imaging device mounted on a substrate;
a bonding wire which electrically connects a pad formed on the solid-state imaging device and a lead formed on the substrate;
a frame member having a frame shape which surrounds side portions of the solid-state imaging device; and
an optical member having optical transparency and mounted on the frame member so as to face an imaging surface of the solid-state imaging device,
wherein the frame member has a leg portion which protrudes from an optical member side toward the imaging surface of the solid-state imaging device,
the frame member and the solid-state imaging device are integrally fixed to each other in a state where the leg portion comes into contact with an intermediate area which is located between an imaging area and a pad forming area on the imaging surface, and
wherein the frame member has a second leg portion which is connected to the leg portion, passes a side of the solid-state imaging device, and terminates without contacting the substrate.

2. The solid-state imaging unit according to claim 1, wherein the leg portion is adhered to the intermediate area on the imaging surface, so that the frame member is fixed to the solid-state imaging device.

3. The solid-state imaging unit according to claim 1, wherein a wire accommodating portion in which the bonding wire connecting the pad and the lead is accommodated is formed between the leg portion and the second leg portion.

4. The solid-state imaging unit according to claim 3, wherein the wire accommodating portion is filled with resin having electrical insulating properties.

5. A method of manufacturing a solid-state imaging unit, comprising:
covering a sensor unit in which a solid-state imaging device is mounted on a substrate and a lead formed on the substrate and a pad formed on the solid-state imaging device are electrically connected to each other by a bonding wire, with a frame member which is formed into the form of a frame surrounding side portions of the solid-state imaging device and has a leg portion formed on the lower surface side so as to protrude toward an imaging surface of the solid-state imaging device, from above the sensor unit;
integrally fixing the frame member and the solid-state imaging device to each other in a state where the leg portion comes into contact with an intermediate area which is located between an imaging area and a pad forming area on the imaging surface; and
mounting an optical member having optical transparency on an upper surface side of the frame member so as to face the imaging surface of the solid-state imaging device,
wherein the frame member has a second leg portion which is connected to the leg portion, passes a side of the solid-state imaging device, and terminates without contacting the substrate.

6. The method of manufacturing a solid-state imaging unit according to claim 5, wherein the leg portion is adhered to the intermediate area on the imaging surface, so that the frame member is fixed to the solid-state imaging device.

7. A method of manufacturing a solid-state imaging unit, comprising:
covering a sensor unit in which a solid-state imaging device is mounted on a substrate and a lead formed on the substrate and a pad formed on the solid-state imaging device are electrically connected to each other by a bonding wire, with an optical unit which includes a frame member which is formed into the form of a frame surrounding side portions of the solid-state imaging device and has a leg portion formed on the lower surface side so as to protrude toward an imaging surface of the solid-state imaging device, and an optical member having optical transparency and mounted on the upper surface side of the frame member, from above the sensor unit; and
integrally fixing the frame member and the solid-state imaging device to each other in a state where the optical member faces the imaging surface of the solid-state imaging device and the leg portion comes into contact with an intermediate area which is located between an imaging area and a pad forming area on the imaging surface,
wherein the frame member has a second leg portion which is connected to the leg portion, passes a side of the solid-state imaging device, and terminates without contacting the substrate.

8. The method of manufacturing a solid-state imaging unit according to claim 7, wherein the leg portion is adhered to the intermediate area on the imaging surface, so that the frame member is fixed to the solid-state imaging device.

9. An electronic apparatus comprising:
a solid-state imaging unit; and
a signal processing circuit which processes an output signal of the solid-state imaging unit,
wherein the solid-state imaging unit includes
a solid-state imaging device mounted on a substrate,
a bonding wire which electrically connects a pad formed on the solid-state imaging device and a lead formed on the substrate,
a frame member having a frame shape which surrounds side portions of the solid-state imaging device, and
an optical member having optical transparency and mounted on the frame member so as to face the imaging surface of the solid-state imaging device,
the frame member has a leg portion which protrudes from an optical member side toward the imaging surface of the solid-state imaging device,
the frame member and the solid-state imaging device are integrally fixed to each other in a state where the leg portion comes into contact with an intermediate area which is located between an imaging area and a pad forming area on the imaging surface, and
the frame member has a second leg portion which is connected to the leg portion, passes a side of the solid-state imaging device, and terminates without contacting the substrate.

* * * * *